United States Patent [19]

Ohata

[11] Patent Number: 4,556,895

[45] Date of Patent: Dec. 3, 1985

[54] FIELD-EFFECT TRANSISTOR HAVING A CHANNEL REGION OF A GROUP III-V COMPOUND SEMICONDUCTOR AND A GROUP IV SEMICONDUCTOR

[75] Inventor: Keiichi Ohata, Tokyo, Japan

[73] Assignee: NEC Corporation, Tokyo, Japan

[21] Appl. No.: 488,878

[22] Filed: Apr. 26, 1983

[30] Foreign Application Priority Data

Apr. 28, 1982 [JP] Japan .................................. 57-71981

[51] Int. Cl.[4] ...................... H01L 29/78; H01L 29/12; H01L 29/161; H01L 27/02
[52] U.S. Cl. .................................. 357/23.7; 357/23.2; 357/58; 357/16; 357/42; 357/41
[58] Field of Search .......... 357/23 NS, 23 TF, 23 D, 357/16, 4, 42, 58, 41, 23.2, 23.7, 22

[56] References Cited

U.S. PATENT DOCUMENTS

| | | | |
|---|---|---|---|
| 3,263,095 | 7/1966 | Fang | 357/16 |
| 3,283,221 | 11/1966 | Heiman | 357/42 |
| 3,708,731 | 1/1973 | McDonald | 357/41 |
| 4,163,237 | 7/1979 | Dingle | 357/58 |
| 4,424,525 | 1/1984 | Mimura | 357/4 |

FOREIGN PATENT DOCUMENTS

| | | | |
|---|---|---|---|
| 0117281 | 9/1980 | Japan | 357/16 |
| 0061675 | 4/1983 | Japan | 357/42 |
| 0102561 | 6/1983 | Japan | 357/16 |
| 0130572 | 8/1983 | Japan | 357/16 |
| 0130574 | 8/1983 | Japan | 357/16 |

Primary Examiner—Andrew J. James
Assistant Examiner—Mark Prenty
Attorney, Agent, or Firm—Sughrue, Mion, Zinn, Macpeak & Seas

[57] ABSTRACT

A field-effect semiconductor device having a channel region formed of two superimposed semiconductor layers, each layer being of a different type semiconductor. As between these two kinds of semiconductors, both the electron affinity and the sum of the electron affinity and the energy gap of one semiconductor is larger than the electron affinity and the sum of the electron affinity and the energy gap of the other semiconductor. This relationship is obtained by forming one of the semiconductor layers of Group III-V compound semiconductor and the other of Group IV semiconductor. The fabrication of the field-effect semiconductor device of this invention into monolithic integrated circuits is also disclosed.

25 Claims, 7 Drawing Figures

FIELD-EFFECT TRANSISTOR HAVING A CHANNEL REGION OF A GROUP III-V COMPOUND SEMICONDUCTOR AND A GROUP IV SEMICONDUCTOR

BACKGROUND OF THE INVENTION

The present invention relates to a field-effect semiconductor device which has a novel construction and which is based upon a novel operating principle.

In recent years, compound semiconductors made of elements from Groups III and V have been used in attempts to realize a monolithic integrated circuit (IC) with a higher operating speed than a silicon IC because these compounds have a high electron mobility. At present, a typical IC using these semiconductor compounds is composed of N-channel field-effect transistors (FET).

For reducing power consumption, however, it is advantageous to fabricate an IC with complementary transistors. Nevertheless, even if they can be used, complementary transistors cannot be expected to operate at high speed because their hole mobility is low.

If a semiconductor other than the Group III-V compound semiconductor is used as a high hole mobility material, P-channel and N-channel field-effect transistors operating at high speed cannot be combined into a monolithic IC. There, it is advantageous to devise a field-effect transistor which acts as both an N-channel element and a P-channel element. Such a field-effect transistor permits the easy formation of complementary transistors in a monolithic IC.

A typical field-effect transitor acting as both an N- and P-channel element in the prior art is disclosed in U.S. Pat. No. 3,283,221 granted to Frederic P. Heiman. In this patent, the channel portion of a field-effect transistor having an MOS (Metal-Oxide-Semiconductor) structure is formed by diffusion or vapor growth of superimposed P- and N-type silicon layers. This structure uses silicon which has a low electron mobility, so that the N-channel transistors cannot be expected to operate at high speed. In the specification of the patent, it is also disclosed that the channel portion may be made of a semiconductor other than silicon, and may have its P- and N-type layers made of different substances. However, at best that disclosure only hints at the possibility, but fails to provide any specific details.

SUMMARY OF THE INVENTION

It is an object of the present invention to provide a field-effect transistor which can operate at high speed regardless of whether it is operating as a P-channel or an N-channel transistor.

Another object of the present invention is to provide a field-effect transistor from which can be formed a monolithic IC that can operate at high speed with low power consumption.

According to the present invention, a field-effect transistor has a channel portion made of at least two kinds of superimposed semiconductor layers. As between these two kinds of semiconductor layers, the electron affinity as well as the sum of the electron affinity and the energy gap of one of these two kinds of semiconductor layers are both larger than the electron affinity and the sum of the electron affinity and the energy gap of the other of the two kinds of semiconductor layers. Moreover, it is desirable that one of these two semiconductors is selected from Group III-V compound semiconductors, whereas the other is selected from Group IV semiconductors.

At the channel portion, one of the two kinds of semiconductor layers stores electrons in response to a positive gate voltage, whereas the other stores holes in response to a negative gate voltage. The above relationships between the electron affinities (which correspond to the energies at the lower edge of the conduction band) and the sums (which corresponds to the energies at the upper edge of the valence band) of the electron affinities and the energy gaps of the two semiconductor layers differentiate the operations of the two semiconductors. As a result, the semiconductor layers of the channel portion operate as either an N-type or P-type channel, depending upon the polarity of the voltage applied to a gate electrode. Thus, the field-effect transistor of the present invention can operate either as an N-channel transistor or a P-channel transistor.

The differences in the electron affinity and the sum of the electron affinity and the energy gap are theoretically larger than 0.1 eV and lower than a value at which the valence band of one semiconductor reaches the conduction band of the other semiconductor. The lower limit of 0.1 eV is necessary to prevent the thermally excited carriers from moving to the conduction band of the adjacent semiconductor.

Further, since the conduction channels are formed separate from the surface region of the semiconductor layers, i.e., a portion which is in contact with a gate oxide film, the electric carriers move at a high speed without being influenced by the surface states. Moreover, since the carriers move straight along the junction between the two semiconductor layers at the conduction channel, the high-speed operating characteristics are also improved. High operating speeds can be attained for either the N-channel transistor or the P-channel transistor, if the channel portion is made of a Group III-V compound semiconductor which has a high electron mobility and a Group IV semiconductor which has a high hole mobility.

As has been described above, according to the present invention, since the field-effect transistor can operate either as an N-channel or a P-channel transistor, it is sufficient that elements having identical structures are formed as an N-channel element and a P-channel element for forming a complementary structure. In other words, a complementary structure capable of operating with low power consumption can be efficiently made.

BRIEF DESCRIPTION OF THE DRAWINGS

The above and further objects, features and advantages of the present invention will become more apparent from the following description of embodiments taken in conjunction with the accompanying drawings, wherein.

DESCRIPTION OF THE PREFERRED EMBODIMENTS

Figure 1:
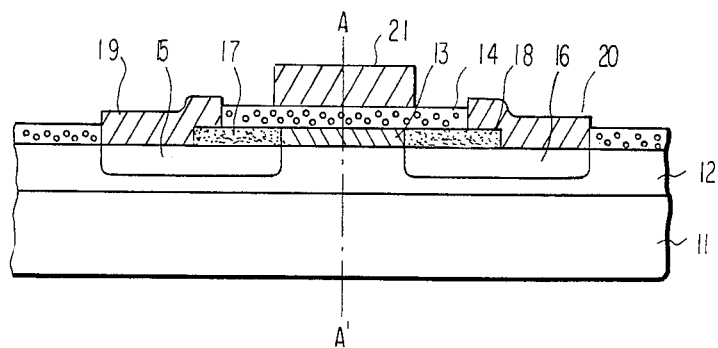
FIG. 1 is a sectional view of a first embodiment of the present invention.

According to a first embodiment of the present invention shown in FIGS. 1 to 4, an intrinsic InP layer 12 of 1 μm is deposited by vapor growth on a high resistivity base 11 made of a semi-insulator InP layer. This InP layer 12 has N++ InP regions 15 and 16 which are made to have a high N-type concentration by implanting impurities of Ge under an acceleration energy of 200 KV and a dose of $2 \times 10^{14}$ cm$^{-2}$. These N++ InP regions 15 and 16 have a depth of 0.1 μm and an impurity concentration of $2 \times 10^{18}$ cm$^{-3}$, and are partially covered by a vapor grown layer of germanium (for example, 200 Å in thickness). The Ge layer provides an intrinsic Ge layer 13 between the N++ InP regions 15 and 16, and also provides P++ type regions 17 and 18 over the N++ InP regions 15 and 16. The P++ regions 17 and 18 are prepared so as a high concentration of $2 \times 10^{18}$ cm$^{-3}$ by implanting impurities of In under an acceleration energy of 30 KV and a dose of $5 \times 10^{13}$ cm$^{-2}$. Source and drain electrodes 19 and 20 made of aluminum, for example, are each formed to contact one of the N++ InP regions 15 and 16, and one of the P++ Ge regions 17 and 18, respectively. A silicon oxide film is so formed as to have a thickness of 600 Å, for example, and to provide a gate insulator film 14 between source and drain electrodes 19 and 20, and a passivation film in the remaining region. A gate electrode 21 made of aluminum, for example, is formed on the gate insulator film 14.

Figure 2:
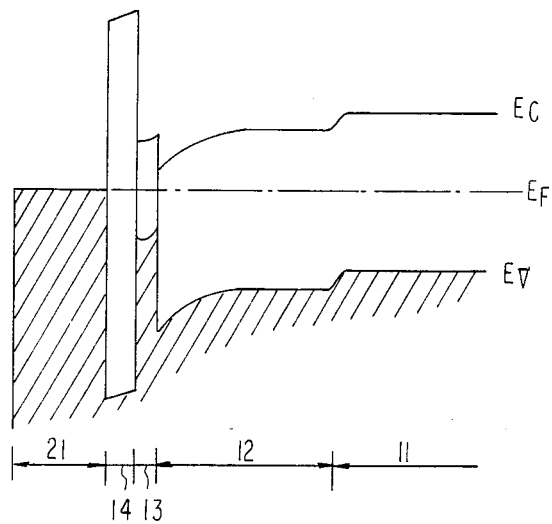
FIG. 2 is a diagram illustrating the energy bands in a thermal equilibrium state, taken along the line A—A' of FIG. 1.
Figure 3:
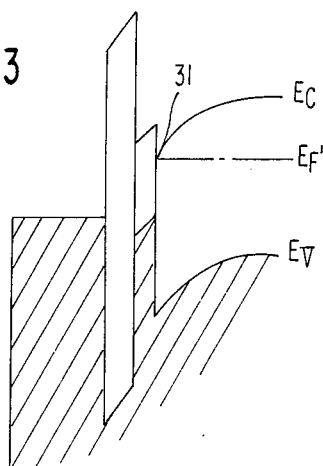
FIG. 3 is a diagram illustrating the energy bands when a positive voltage is applied to the gate, taken along the line A—A' of FIG. 1.
Figure 4:
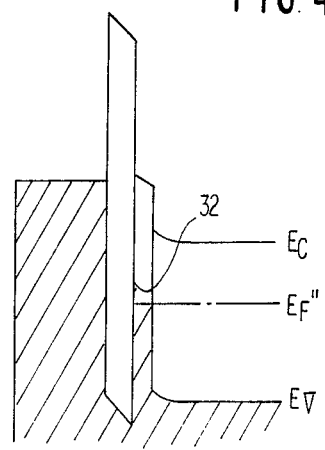
FIG. 4 is a diagram illustrating the energy bands when a negative voltage is applied to the gate, taken along the line A—A' of FIG. 1.

Germanium has an electron affinity of 4.0 eV and an energy gap of 0.76 eV. Indium phosphide has an electron affinity of 4.4 eV and an energy gap of 1.34 eV. Therefore, germanium not only has an electron affinity smaller than that of InP, but also the sum of its electron affinity and its energy gap is smaller than that of InP. As shown in FIG. 2, positive holes are liable to accumulate in the Ge layer 13, whereas electrons are liable to accumulate in the InP layer 12 in contact with the Ge layer 13. In FIG. 2, the letters $E_C$, $E_F$ and $E_V$ designate the conduction band, Fermi level and valence band, respectively. If a positive voltage is applied to the gate 21, the conduction bands of the Ge layer 13 and a portion of the InP layer 12 in contact with the Ge layer are lowered with respect to a quasi Fermi level $E_F'$, as illustrated in FIG. 3. In the junction, however, the conduction band of Ge is 0.4 eV higher than that of InP so that the electrons mainly accumulate on the InP layer 12 side of the interface with the Ge layer 13, thus forming an N-type channel 31. As illustrated in FIG. 4 (where the base 11 is not shown) if a negative voltage is applied to the gate 21, the valence band of the Ge layer 13 is raised with respect to a quasi Fermi level $E_F''$ so that positive holes accumulate on the Ge layer 13 side of the interface with the InP layer 12, thus forming a P-type channel 32.

In short, the prominent characteristics of the present embodiment are that both the electron affinity and the sum of the electron affinity and the energy gap are larger in the InP layer 12 than in the Ge layer 13, and that one of the two semiconductor layers (the InP layer 12) is provided with an N-type channel 31 whereas the other (the Ge layer 13) is provided with a P-type channel 32 thereby ensuring P- and N-channel operations. In the present embodiment, moreover, the semiconductor layer 12 provided with the N-type channel 31 is made of InP which has a high electron mobility of 4000 cm$^2$/V·sec. and a high saturation velocity of electrons, whereas the semiconductor layer 13 provided with the P-type channel is made of Ge which has a high hole mobility of 2,000 cm$^2$/V·sec. As a result, the high-speed operation is excellent regardless of which type of channel is being operated. More specifically, the high-speed operation can be markedly improved for both types of channels thanks to the fact that the semiconductor layer provided with the N-type channel is made of a Group III-V compound semiconductor having a high electron mobility, such as InP, InGaAs, InGaAsP, InAs or InAsP; whereas the semiconductor layer provided with the P-type channel is made of a Group IV semiconductor having a high hole mobility, such as Ge, Si or SiGe. The high-speed operability is also improved by the fact that the channels are formed at a heterogeneous junction between the InP layer 12 and the Ge layer 13. More specifically, the channel region extends through the heterogeneous junction between the InP layer 12 and the Ge layer 13, which is separated from the interface between the Ge layer 13 and the gate insulator film 14 which has many surface energy states. As a result, the high speed operation of the transistor is not damaged by the surface energy states. Moreover, the charge travels along the shortest distance between the source and the drain, because it proceeds straight in the vicinity of the heterogeneous junction, parallel to it, to further enhance the high-speed operability.

In fact, according to the above embodiment, the mobility of N-channel operation is 5,000 cm$^2$/V·sec at room temperature and 100,000 cm$^2$/V·sec at 77° K. and that of P-channel operation is 1,500 cm$^2$/V·sec at room temperature and 20,000 cm$^2$/V·sec at 77° C. On the other hand, the Si dipolar FET in the prior art showed a mobility of 600 cm$^2$/V·sec at room temperature and 1,000 cm$^2$/V·sec at 77° K. for N-channel operation and a mobility of 300 cm$^2$/V·sec at room temperature and 500 cm$^2$/V·sec at 77° K. for P-channel operation.

According to the present embodiment, moreover, since the Ge layer 13 is positioned closer to the gate electrode 21, the change in the number of carriers induced per unit change in the gate voltage is larger in the P-type channel. However, since the positive holes usually have a lower mobility, the change in the current can be equalized for the P- and N-type channels. The charge on the electrons induced when a positive voltage is applied to the gate can be assumed to be approximately proportional to the sum of the capacity of the gate insulator film 14 and the capacity of the Ge layer 13. Therefore, if a SiO$_2$ film having a practical thickness of 100 Å to 1000 Å is selected as the insulated film, the thickness of the Ge layer 13 in practice will be less than a few hundred Å. Incidentally, since the difference in the lattice constant between InP and Ge is relatively large, it is desirable that the thickness of Ge is small. When the Ge layer 13 is doped so as to be N-type, the energy levels of the conduction bands of the Ge layer and the InP layer in contact with the Ge layer become lower than those shown in FIG. 2 so that the threshold voltage for the N-type channel is lowered. Therefore, the threshold voltage can be changed in accordance with the doping level of the Ge layer. Moreover, this change in the threshold voltage can also be effected in accordance with the doping level of the InP layer in the same way as in a usual MOSFET. The structure thus far described with reference to FIG. 1 can operate as a normally-off type of device because both the InP layer 12 and the Ge layer 13 are intrinsic. However, the structure of FIG. 1 may carry a bias current by doping the Ge layer 13 with an impurity.

The embodiment thus far described is directed to the case in which the semiconductor layer 12 is made of InP whereas the semiconductor layer 13 is made of Ge. However, the relatively large difference in the lattice constant between those two semiconductors may increase the number of interface energy states at the junction. If the semiconductor layer 12 is made of $In_{0.2}Ga_{0.8}As$, for example, instead of InP, the possibility of lattice irregularities is reduced further. In this case, moreover, the base 11 is preferably made of semi-insulating GaAs.

Figure 5:
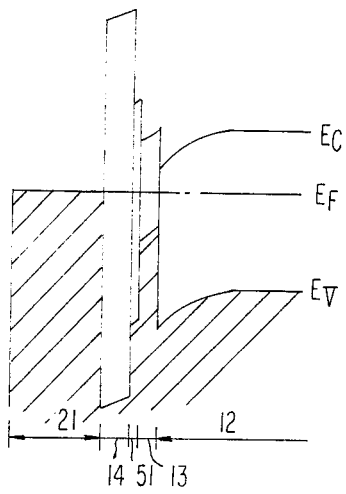
FIG. 5 is a diagram illustrating the energy bands in the channel portion of a second embodiment of the present invention.

According to a second embodiment of the present invention, as shown in FIG. 5, additional semiconductor layer 51 is placed between the Ge layer 13 and the insulator film 14 of the first embodiment. The semiconductor layer 51 has a smaller electron affinity and a larger sum of its electron affinity and its energy gap than those of Ge. The semiconductor layer 51 used is a layer of intrinsic $Ga_{0.7}Al_{0.3}As$ having a thickness of 300 Å, for example. Thanks to this construction, both ends of the Ge layer 13 provide heterogeneous semiconductor-semiconductor junctions so that the operating speed is higher than that in the device in which the Ge layer 13 is in direct contact with the insulator film 14. The mobility of 5,000 $cm^2/V\cdot sec$ at room temperature and 100,000 $cm^2/V\cdot sec$ at 77° K. are expected for N-channel operation, and 3,000 $cm^2/V\cdot sec$ at room temperature and 60,000 $cm^2/V\cdot sec$ at 77° K. for P-channel operation.

Incidentally, when the semiconductor layer 51 with a large energy gap is used as in the present embodiment, the insulated gate composed of the insulator film 14 and the gate electrode 21 can be replaced by a Schottky type of gate in which a metal electrode is directly contacted with the semiconductor layer 51. A metal electrode of Al, Ti, Pt and W are preferable for GaAlAs layer 51. Another modification can be applied in which a semiconductor layer having a smaller electron affinity than InP is similarly provided on the base side of the semiconductor layer 12 thereby narrowing the flow path of the carrier in the semiconductor layer 12. An example of the above-mentioned additional semiconductor layer is $GaAs_{0.5}Sb_{0.5}$ which has an electron affinity of 4.0 eV.

Figure 6:
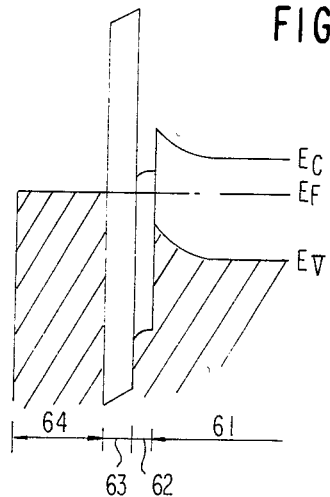
FIG. 6 is a diagram illustrating the energy bands in the channel portion of a third embodiment of the present invention.

A third embodiment of the present invention is constructed such that the InP layer and the Ge layer of the first embodiment are interchanged. An example of the state of the energy bands under a thermally balanced condition is illustrated in FIG. 6. Specifically, a very pure N-type Ge layer 61 having a thickness of 0.3 μm and a very pure InP layer 62 having a thickness of 200 Å are grown in that order on the base (not shown but corresponding to the high resistivity base 11 of FIG. 1). Reference numerals 63 and 64 indicate an insulator film and a gate electrode, respectively. As can be easily understood from FIG. 6, in the present embodiment also, an N-type channel is formed on the InP (62) side, whereas a P-type channel is formed on the Ge (61) side, depending on the polarity of the gate voltage, so that P- and N-channel operations can be attained.

Figure 7:
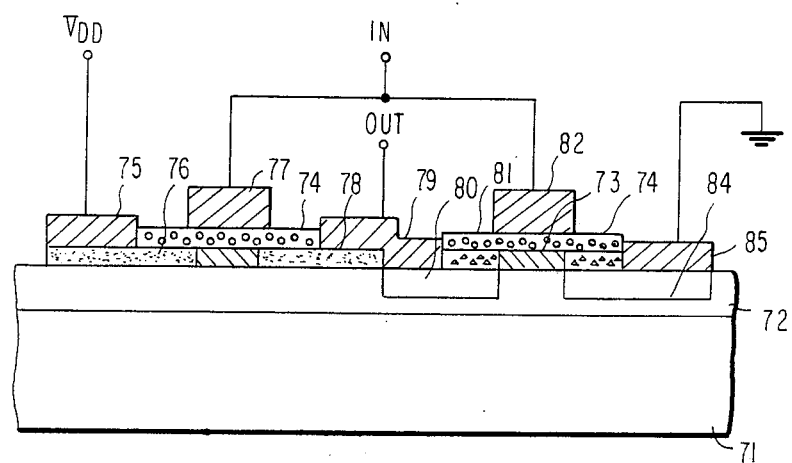
FIG. 7 is a sectional view of a fourth embodiment of the present invention.

A fourth embodiment of the present invention is directed to the structure of an inverter using complementary transistors, as shown in FIG. 7. The device is constructed of a semi-insulating InP base 71, a very pure InP layer 72, a very pure Ge layer 73, an insulator film 74 of $SiO_2$ or the like, a source electrode 75 of a P-channel transistor, a $P^+$-Ge layer 76 for the source region, a gate electrode 77, and a $P^+$ Ge layer 78 for the drain region. The thicknesses or depths and concentrations of the first embodiment may be applied to the corresponding part of this fourth embodiments. Numeral 79 indicates a drain electrode which is shared by the P-channel transistor (left half) and an N-type transistor (right half). The N-channel transistor is similar to the transistor of the first embodiment except for $N^+$-Ge layers 81 and 83 and is constructed of the $N^+$-InP layer 80 for the drain region, the gate electrode 82, the $N^+$InP layer 84 for the source region, and a source electrode 85. The $N^+$-Ge layers 81 and 83 block hole currents to prevent the right half structure from operating as a P-channel device. The P-channel transistor is constructed of $P^+$-Ge layer 78 for the drain region and the source electrode 75. In this structure, the InP layer 72 has no high impurity region. The construction of both the right and left transistors are identical to each other so far as the channel portions are concerned. Differences are in the source and drain regions which are easily formed by impurity ion-implantations. In other words, the complementary transistors can be fabricated from the same semiconductor materials by injecting selected impurity ions. In addition, since the P-type and N-type channels are respectively formed in a layer of Ge having a high hole mobility and a layer of InP having a high electron mobility, high-speed operations are attained in both the P-channel and N-channel transistors. This fact allows the complementary circuits operable at high-speed to be fabricated in a monolithic integrated circuit.

As has been described above, the semiconductor device according to the present invention makes it possible to provide a high-speed transistor and also high-speed complementary transistors which have not been possible before.

What is claimed is:

1. A field-effect transistor comprising: a channel portion including a first semiconductor layer of an intrinsic semiconductor having a first electron affinity and a first energy gap and a second semiconductor layer of an intrinsic semiconductor having a second electron affinity and a second energy gap, said second semiconductor layer formed over said first semiconductor layer, said second electron affinity being smaller than said first electron affinity and the sum of said second electron affinity and said second energy gap being smaller than the sum of said first electron affinity and said first energy gap; a source region and a drain region in electrical contact with said channel portion and formed separated from each other; and a gate means for applying an electric field to said channel portion.

2. A field-effect transistor according to claim 1, wherein said gate means includes an insulator film formed over said channel portion, and a gate electrode formed on said insulator film.

3. A field-effect transistor according to claim 2, wherein said first semiconductor layer is made of a Group III-V compound semiconductor, and wherein the second semiconductor is made of a Group IV semiconductor.

4. A field-effect transistor according to claim 3, wherein said Group III-V compound semiconductor is selected from the group consisting of InP, InGaAs, InGaAsP, InAs, and InAsP, whereas said semiconductor of an element from Group IV is selected from the group consisting of Ge, Si and SiGe.

5. A field-effect transistor according to claim 2, further comprising a third semiconductor layer interposed between said gate means and said channel portion.

6. A field-effect transistor according to claim 5, wherein said third semiconductor layer is directly formed on said second semiconductor layer on the side opposite to said first semiconductor layer, said third semiconductor layer having a third electron affinity and a third energy gap, said third electron affinity being smaller than said second electron affinity and the sum of said third electron affinity and said third energy gap being larger than the sum of said second electron affinity and said second energy gap.

7. A field-effect transistor according to claim 6, wherein said third semiconductor layer is made of GaAlAs.

8. A complementary semiconductor device comprising: first and second field-effect transistors each including a channel portion, which has a first semiconductor layer having no impurity for determining conductivity type and a second semiconductor layer formed over said first semiconductor layer, said second semiconductor layer having no impurity for determining conductivity type and having an electron affinity and the sum of the electron affinity and an energy gap smaller than those of said first semiconductor layer, a source region, a gate region and a drain region; circuit means for causing said first field-effect transistor to act as an N-channel element; and circuit means for causing said second field-effect transistor to act as a P-channel element.

9. A complementary semiconductor device according to claim 8, wherein the first semiconductor layers of said first and second field-effect transistors are constructed of a common semiconductor layer.

10. A complementary semiconductor device according to claim 9, wherein said first semiconductor layer is made of a Group III-V compound semiconductor, and wherein the other semiconductor is made of a Group IV semiconductor.

11. A field-effect transistor comprising: a channel portion including a first semiconductor layer of an intrinsic semiconductor having a first electron affinity and a first energy gap and a second semiconductor layer of an intrinsic semiconductor having a second electron affinity and a second energy gap, said second semiconductor layer being formed over said first semiconductor layer, said second electron affinity being larger than said first electron affinity and the sum of said second electron affinity and said second energy gap being larger than the sum of said first electron affinity and said first energy gap; a source region and a drain region in electrical contact with said channel portion and formed separated from each other; and a gate means for applying an electric field to said channel portion.

12. A field-effect transistor according to claim 11, wherein said gate means includes an insulator film formed over said channel portion, and a gate electrode formed on said insulator film.

13. A field-effect transistor according to claim 11, wherein said first semiconductor layer is made of a Group IV semiconductor, and wherein the second semiconductor is made of a Group III-V compound semiconductor.

14. A field-effect transistor according to claim 13, wherein said Group III-V compound semiconductor is selected from the group consisting of InP, InGaAs, InGaAsP, InAs, and InAsP, whereas said semiconductor of an element from Group IV is selected from the group consisting of Ge, Si and SiGe.

15. A field-effect transistor according to claim 12, further comprising a third semiconductor layer interposed between said gate means and said channel portion.

16. A field-effect transistor according to claim 12, wherein said third semiconductor layer is directly formed on said second semiconductor layer on the side opposite to said first semiconductor layer.

17. A complementary semiconductor device comprising: first and second field-effect transistors each including a channel portion, which has a first semiconductor layer having no impurity for determining conductivity type and a second semiconductor layer formed over said first semiconductor layer, said second semiconductor layer having no impurity for determining conductivity type and having an electron affinity and the sum of the electron affinity and an energy gap larger than those of said first semiconductor layer, a source region, a gate region and a drain region; circuit means for causing said first field-effect transistor to act as an N-channel element; and circuit means for causing said second field-effect transistor to act as a P-channel element.

18. A complementary semiconductor device according to claim 17, wherein the first semiconductor layers of said first and second field-effect transistors are constructed of a common semiconductor layer.

19. A complementary semiconductor device according to claim 18, wherein one of said first semiconductor layer is madee of a Group IV semiconductor, and wherein the other semiconductor is made of a Group III-V compound semiconductor.

20. A field-effect transistor as claimed in claim 1, further comprising a third semiconductor layer interposed between said gate means and said channel portion, said gate means comprising metal electrode formed on said third semiconductor layer.

21. A field-effect transistor as claimed in claim 20, wherein said metal electrode is selected from a group consisting of Al, Ti, Pt and W.

22. A field-effect transistor as claimed in claim 11, further comprising a third semiconductor layer interposed between said gate means and said channel portion, said gate means comprising metal electrode formed on said third semiconductor layer.

23. A field-effect transistor as claimed in claim 22, wherein said metal electrode is selected from a group consisting of Al, Ti, Pt and W.

24. A field-effect transistor as claimed in claim 1, further comprising a third semiconductor layer directly formed on said first semiconductor layer on the side opposite to said second semiconductor layer, said third semiconductor layer having an electron affinity smaller than the electron affinity of said first semiconductor layer.

25. A field-effect transistor as claimed in claim 24, wherein said third semiconductor layer is made of GaAsSb.

* * * * *